(12) United States Patent
Bruner et al.

(10) Patent No.: US 10,627,426 B2
(45) Date of Patent: Apr. 21, 2020

(54) METHOD AND KIT FOR CLEANING AND COATING A TIP OF A TEST PROBE UTILIZED IN A TEST SYSTEM FOR AN INTEGRATED CIRCUIT PACKAGE

(71) Applicant: ACULON, INC., San Diego, CA (US)

(72) Inventors: Eric L Bruner, La Jolla, CA (US); Eric L. Hanson, Carlsbad, CA (US)

(73) Assignee: ACULON INC., San Diego, CA (US)

( * ) Notice: Subject to any disclaimer, the term of this patent is extended or adjusted under 35 U.S.C. 154(b) by 92 days.

(21) Appl. No.: 15/919,078

(22) Filed: Mar. 12, 2018

(65) Prior Publication Data

US 2019/0277883 A1  Sep. 12, 2019

(51) Int. Cl.
| | | |
|---|---|---|
| *G01R 1/067* | (2006.01) | |
| *B05D 1/18* | (2006.01) | |
| *B05D 1/28* | (2006.01) | |

(52) U.S. Cl.
CPC ......... *G01R 1/06761* (2013.01); *B05D 1/185* (2013.01); *B05D 1/283* (2013.01); *G01R 1/06722* (2013.01)

(58) Field of Classification Search
CPC ..... G01R 1/6761; G01R 1/6722; B05D 1/185
See application file for complete search history.

(56) References Cited

U.S. PATENT DOCUMENTS

| | | | |
|---|---|---|---|
| 6,617,165 B1 * | 9/2003 | Opitz | C23C 22/77 436/103 |
| 7,396,594 B2 | 7/2008 | Schwartz et al. | |
| 7,712,177 B2 * | 5/2010 | Yoshida | B08B 7/0014 134/2 |
| 8,025,974 B2 | 9/2011 | Hanson et al. | |
| 8,236,426 B2 | 8/2012 | Hanson et al. | |
| 8,445,423 B2 | 5/2013 | Bruner et al. | |
| 8,945,312 B2 * | 2/2015 | Srutkowski | B08B 1/00 134/6 |
| 9,823,273 B2 * | 11/2017 | Martin | G01R 3/00 |
| 2002/0190737 A1 * | 12/2002 | Maekawa | B08B 1/00 324/758.04 |
| 2006/0194008 A1 * | 8/2006 | Schwartz | A61L 27/32 428/34.4 |
| 2008/0184505 A1 * | 8/2008 | Feroli | A46B 13/00 15/21.1 |
| 2012/0275026 A1 * | 11/2012 | Zhou | B82Y 30/00 359/601 |

(Continued)

*Primary Examiner* — Dominic E Hawkins
(74) *Attorney, Agent, or Firm* — Blynn L. Shideler; Krisanne Shideler; BLK Law Group

(57) ABSTRACT

A kit for cleaning and coating a tip of a test probe in an integrated circuit package test system is provided. The kit comprises a transfer stamp having a porous material impregnated with a phosphonic acid solution. The size and shape of the transfer stamp approximate those of the integrated circuit package being tested. Also provided is a method of cleaning and coating a tip of a test probe in an integrated circuit package test system. The method includes aligning the test system with a transfer stamp comprising a porous material that is impregnated with a phosphonic acid solution; pushing the test probe into the porous material to coat the tip with the phosphonic acid solution; removing the test probe; and allowing the phosphonic acid solution to dry on the tip of the test probe and form a self-assembled monolayer of phosphonates thereon. A test probe is also provided.

12 Claims, 3 Drawing Sheets

(56) References Cited

U.S. PATENT DOCUMENTS

2014/0338698 A1* 11/2014 Humphrey ............ B08B 7/0028
134/6
2017/0176495 A1* 6/2017 Yin .................... G01R 1/06761

* cited by examiner

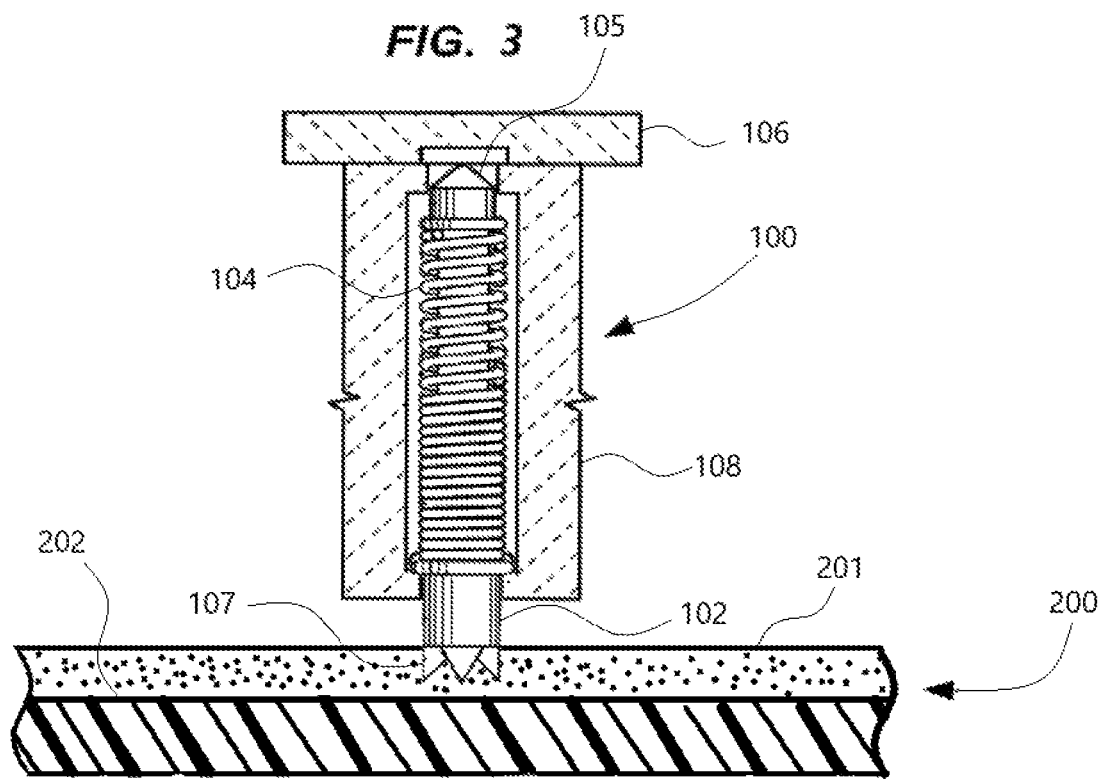

METHOD AND KIT FOR CLEANING AND COATING A TIP OF A TEST PROBE UTILIZED IN A TEST SYSTEM FOR AN INTEGRATED CIRCUIT PACKAGE

FIELD OF THE INVENTION

The present invention relates to methods and kits for cleaning and coating a tip of a test probe utilized in a test system for an integrated circuit package, and to coated test probes prepared therefrom.

BACKGROUND OF THE INVENTION

In the manufacture of a microelectronic device, circuit packages are formed having an array of pins, pads, or lands that make contact with the rest of the device, typically through a printed circuit board. After production, each package must be tested to ensure that it has been manufactured correctly and all electrical contacts operate effectively.

To perform the tests, the packages may have lands, pads, or solder balls specifically included in the package for test purposes ("test contacts"). There is also an array of contacts that are used for normal operations, often in the form of solder balls.

In an integrated circuit test system, the test probes often comprise spring and sleeve connectors in which one or both ends of a cylindrical probe are spring-loaded to apply pressure against the test contacts of the package. One common type of spring-loaded test probe is referred to as a pogo pin. The test probes are mounted adjacent to a circuit board or attached to a substrate in a socket that aligns each probe in the proper position with respect to each respective contact so that when the package is pressed against the socket, each probe will effectively contact its respective contact such as a land, ball or pad. The probes also have a shaped tip so that when the probes are pressed against the package, the spring pressure will cause the tip to break through any oxide that has formed on the surface of the associated contact to ensure a good electrical connection. Signals are sent or received through the probes to test the device.

The tip of a test probe wears with each contact against the associated contact such as a solder ball test contact; the tip may also collect contaminants from the package connection. As a result, each test probe has a limited number of contacts and therefore a limited number of package tests that it can perform, after which the test probe is ineffective and must be replaced. With thousands of test probes in each socket, test probe replacement is a factor in the cost of device manufacturing. The pogo pin is used for many different testing functions, including burn in, class test, and system test. Because there are thousands of pins per socket, the pins represent a significant part of the cost of unit interface tooling (UIT).

As the test probe is repeatedly used, there are several different mechanisms that wear and contaminate the tip of the probe, rendering it unreliable. Typical plunger or cylinder materials include Pd alloy, steel, or Cu/Be alloy. In some cases, Au/Ni layers are coated over the tip to provide oxidation protection and improve electrical conduction. With repeated cycling, the plunger can degrade and become dulled, leading to an ineffective contact between the test probe tip and the tested unit. There may be an increase in the contact resistance (Cres) at the tip of the test probe. An initially sharp shape becomes dulled and no longer penetrates the solder ball. In addition, any coating layers on the probe tip may be worn off.

Each time the probe tip contacts a new package contact, it may also pick up contaminants. Sn, PbO and SnO are among the most common contaminants that a probe tip can pick up from a solder ball. Also, with the increasing use of No-Clean Paste (NCP) for Ball Grid Array (BGA) packages, a substantial amount of organic residue such as rosin remains on the solder ball and can be transferred to the probe tip. This can cause a socket open failure. The contaminants can be controlled by cleaning; however, regular cleaning is very expensive and time consuming, it takes the tool out of service and further wears on the tip. Mechanical rubbing, for example, can accelerate pogo-pin wearing, and speed up pin degradation failures.

It would be desirable to provide a convenient and cost effective kit and method for cleaning and coating a tip of a test probe in an integrated circuit package test system that removes contaminants and provides protection to the test probe, allowing for extended use.

SUMMARY OF THE INVENTION

A kit for cleaning and coating a tip of a test probe utilized in a test system for an integrated circuit package is provided. The kit comprises a transfer stamp comprising a porous material that is impregnated with a solution of phosphonic acid. The transfer stamp has a size and shape that approximate those of the integrated circuit package being tested.

Also provided is a method of cleaning and coating a tip of a test probe in a test system for an integrated circuit package. The method comprises: 1) aligning the integrated circuit package with a transfer stamp comprising a porous material that is impregnated with a solution of phosphonic acid; 2) pushing the test probe into the porous material of the transfer stamp to coat the tip with the solution of phosphonic acid; 3) removing the test probe from the porous material of the transfer stamp; and 4) allowing the solution of phosphonic acid to dry on the tip of the test probe and form a self-assembled monolayer of phosphonates thereon. The present invention further provides a test probe in a test system for an integrated circuit package, comprising a tip that is coated with a self-assembled monolayer of phosphonates.

BRIEF DESCRIPTION OF THE DRAWINGS

FIG. 3 is a cross-sectional side view of the spring-loaded test probe of FIG. 1 being pushed into the transfer stamp of FIG. 2 for cleaning and coating the probe tip with a self-assembled monolayer of phosphonates according to one embodiment of the present invention.

DETAILED DESCRIPTION OF THE INVENTION

Other than in any operating examples, or where otherwise indicated, all numbers expressing quantities of ingredients, reaction conditions and so forth used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contain certain errors necessarily resulting from the standard deviation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

As used in this specification and the appended claims, the articles "a," "an," and "the" include plural referents unless expressly and unequivocally limited to one referent.

The various aspects and examples of the present invention as presented herein are each understood to be non-limiting with respect to the scope of the invention.

Figure 1:
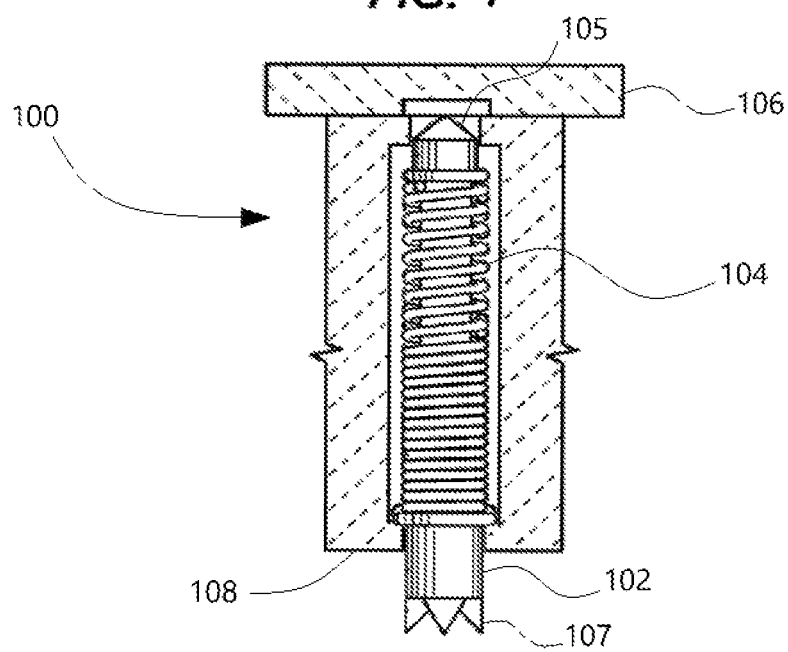
FIG. 1 is a cross-sectional side view of an exemplary spring-loaded test probe in a socket body with a pusher plate comprising a tip that is coated with a self-assembled monolayer of phosphonates according to one embodiment of the present invention.

The present invention provides a kit for cleaning a tip 107 of a test probe 100 utilized in a test system for an integrated circuit package, and coating the tip with a self-assembled monolayer of phosphonates. A cross-sectional side view of an exemplary spring-loaded test probe 100 in a socket body 108 with a pusher plate 106 is illustrated in FIGS. 1 and 3. The present invention can be implemented with many test probes and the details of the test probe 100 as illustrated, other than the coating and cleaning thereof, are shown in U.S. Patent Publication 2017-0176495, which is incorporated herein by reference in its entirety.

An integrated circuit test probe 100, which may be one of several hundred or even thousands in an integrated circuit package, comprises a main plunger body or cylinder 102 that is partially inside a sleeve. The cylinder 102 is longer than the sleeve and reciprocates within the sleeve. A spring 104 is attached to the cylinder 102 and the sleeve to drive the cylinder in a particular direction. The cylinder 102 has an end 105 for contacting the pusher plate 106 and a tip 107 for engaging a contact such as a solder ball of a ball grid array or any other type of connection array of an integrated circuit package. The tip 107 of the plunger body 102 can be made of any of a number of electrically conductive materials, and manufactured into different shapes, such as a crown shape as shown in FIG. 1 to provide stable contact with the solder ball type contacts. The sleeve of the test probe 100 is mounted to a socket 108 and fixed in place within the socket 108. In this example, the test probe may include a housing wherein sleeve threads are screwed into the housing to hold the sleeve, and the housing is attached to the socket 108 using an adhesive or another suitable attachment technique. The pusher plate 106 is pressed against the end 105 to drive the cylinder 102 toward a test contact or an electrical contact in a package. In FIG. 1, the probe 100 is shown in the engaged position; when the pusher plate 106 is released, the spring 104 relaxes and the cylinder 102 moves upward in the socket 108.

Figure 2:
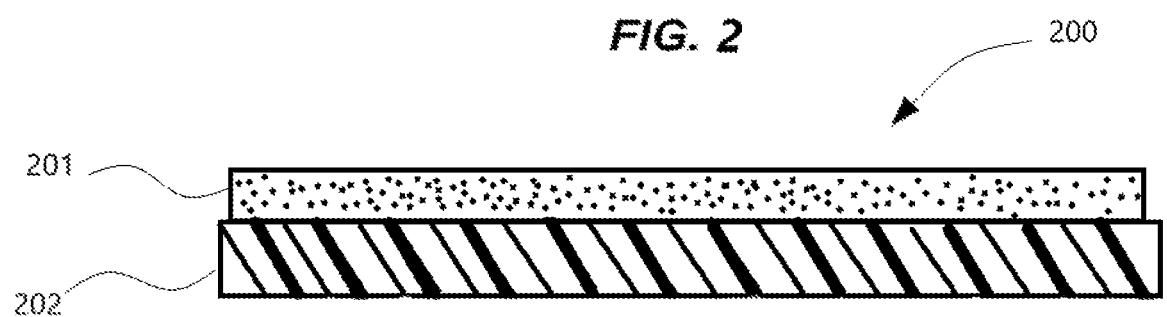
FIG. 2 is a cross-sectional side view of a transfer stamp configured for cleaning and coating a probe tip with a self-assembled monolayer of phosphonates according to one embodiment of the present invention.

The kit according to the present invention comprises a transfer stamp 200 as shown in FIGS. 2 and 3, comprising a porous material 201 that is impregnated with a solution of a phosphonic acid. The transfer stamp 200 may further comprise a non-porous backing material 202 that is attached to and serves to support the porous material. The transfer stamp 200 typically has a size (surface area) and shape that approximate those of the integrated circuit package being tested. For example, the transfer stamp 200 may have the size and shape of a semiconductor chip. This is to facilitate alignment of the integrated circuit package test system with the transfer stamp 200 and ensure that the test probes 100 are thoroughly cleaned and coated when pushed into the transfer stamp 200.

The porous material 201 is soft enough to allow for the tip 107 of the test probe(s) 100 to be pushed into it. The porous material typically comprises a sponge or foamed polymer such as foamed polyurethane, polypropylene, or polyethylene. The transfer stamp 200 often further comprises a non-porous backing material 202 attached to and supporting the porous material. The backing material 202 is shown in FIG. 2 as comprising metal, but may comprise any non-porous material that is sufficiently rigid to structurally support the porous material; for example, glass or a polymer such as high density polyethylene or polypropylene. The backing material 202 may be attached to the porous material 201 using an adhesive.

The porous material 201 of the transfer stamp 200 is impregnated with a solution of a phosphonic acid. Suitable examples of phosphonic acids include organophosphonic acids such as amino trismethylene phosphonic acid, aminobenzylphosphonic acid, 3-amino propyl phosphonic acid, O-aminophenyl phosphonic acid, 4-methoxyphenyl phosphonic acid, aminophenylphosphonic acid, aminophosphonobutyric acid, aminopropylphosphonic acid, benzhydrylphosphonic acid, benzylphosphonic acid, butylphosphonic acid, carboxyethylphosphonic acid, diphenylphosphinic acid, dodecylphosphonic acid, ethylidenediphosphonic acid, heptadecylphosphonic acid, methylbenzylphosphonic acid, naphthylmethylphosphonic acid, octadecylphosphonic acid, octylphosphonic acid, pentylphosphonic acid, phenylphosphinic acid, phenylphosphonic acid, bis-(perfluoroheptyl) phosphinic acid, perfluorohexyl phosphonic acid, styrene phosphonic acid, and/or dodecyl bis-1,12-phosphonic acid. Note that the phrase "and/or" when used in a list is meant to encompass alternative embodiments including each individual component in the list as well as any combination of components. For example, the list "A, B, and/or C" is meant to encompass seven separate embodiments that include A, or B, or C, or A+B, or A+C, or B+C, or A+B+C. In addition to the monomeric phosphonic acids, oligomeric or polymeric acids resulting from self-condensation of the respective monomeric acids may be used.

The phosphonic acid is typically dissolved or dispersed in a diluent. Suitable diluents include alcohols having 1 to 4 carbon atoms such as such as methanol, ethanol, n-propanol, isopropanol, n-butanol, and/or isobutanol; aliphatic hydrocarbons such as hexane, isooctane and decane; ethers, for example, tetrahydrofuran; and dialkylethers such as diethylether. Perfluorinated compounds such as perfluorinated tetrahydrofuran are also suitable. Also, aqueous alkaline solutions of sodium and/or potassium hydroxide can be used as the diluent.

Adjuvant materials may be present with the phosphonic acid and the diluent (organic acid compositions). Examples include surface active agents, stabilizers, wetting agents and anti-static agents known in the art. When used, the adjuvants are present in amounts of up to 30 percent by weight based on the non-volatile content of the organic acid composition.

The concentration of the phosphonic acid in the solution is not particularly critical but is at least 0.01 millimolar, typically 0.01 to 100 millimolar, and more typically 0.1 to 50 millimolar. The phosphonic acid composition can be prepared by mixing all of the components at the same time or by adding the components in several steps.

The thickness of the porous material 201 on the transfer stamp 200 is sufficient to allow for complete submersion of a test probe tip 107 into the material 201. Usually the porous material 201 is 300 to 500 microns; often about 400 microns in thickness. The thickness of the backing material 202 on the transfer stamp 200 is sufficient to provide rigidity and structural support to the stamp 200. Usually it is 300 to 500 microns; often about 360 to 400 microns in thickness.

The kits of the present invention are suitable for use in a method of cleaning and coating a tip 107 of a test probe 100 in a test system for an integrated circuit package. The method comprises: 1) aligning the integrated circuit package with a transfer stamp 200 comprising a porous material 201 that is impregnated with a solution of phosphonic acid; 2) pushing the tip 107 of the test probe 100 into the porous material 201 of the transfer stamp 200 as shown in FIG. 3 to coat the tip 107 with the solution of phosphonic acid; 3) removing the test probe 100 from the porous material 201 of the transfer stamp 200; and 4) allowing the solution of phosphonic acid to dry on the tip 107 of the test probe 100 and form a self-assembled monolayer of phosphonates thereon.

In the first step of the method, an integrated circuit package comprising an array of test probes 100 is aligned with the transfer stamp 200. Typically each test probe 100 comprises a pogo-pin or plunger 102 that is spring-loaded within a socket 108. The transfer stamp 200 may be any of those described above, and has a size and shape that approximate those of the integrated circuit package being tested to facilitate alignment and ensure thorough coating of the probe tips 107.

In the second step of the method, shown in FIG. 3, each test probe 100 of an array of probes 100 is pushed into the porous material 201 of the transfer stamp 200 to clean and coat the tip 107 with the solution of phosphonic acid. For simplicity, only one test probe 100 of the array is shown in FIG. 3. The time of treatment is not particularly critical and is usually from as short as 1 second to 60 minutes. The time required for treatment can be adjusted to a significant extent, for example, by varying the concentration of the phosphonic acid in the solution. Each test probe 100 is then removed from the porous material 201 of the transfer stamp 200; and the solution of phosphonic acid is allowed to dry on the tips 107 of each of the test probes 107 and form a self-assembled monolayer of phosphonates thereon. Drying typically occurs at ambient conditions; by "ambient conditions" is meant the condition of surroundings without adjustment of the temperature, humidity or pressure. Usually ambient temperature ranges from 60 to 90° F. (15.6 to 32.2° C.), such as a typical room temperature, 72° F. (22.2° C.). Heat may be applied to facilitate drying.

The self-assembled monolayer of phosphonates typically demonstrates a thickness less than 5 nanometers, such as less than 3 nanometers. The layer demonstrates a very uniform thickness over the surface of the probe tip and serves as a conformal coating. The thickness of the layer over the surface of the tip typically varies by no more than 50 percent.

The present invention further provides a test probe 100 in a test system for an integrated circuit package. The test probe 100 comprises a tip 107 that is coated with a self-assembled monolayer of phosphonates, which test probe is illustrated in FIG. 1. The test probe 100 may be spring-loaded within a socket 108 as a pogo-pin 102, or may comprise any other known type of test probe. The test probe 100 may be prepared using any of the methods described above.

Whereas particular embodiments of this invention have been described above for purposes of illustration, it will be evident to those skilled in the art that numerous variations of the details of the present invention may be made without departing from the scope of the invention as defined in the appended claims.

What is claimed is:

1. A kit for cleaning and coating a tip of a test probe utilized in a test system for an integrated circuit package, said kit comprising a transfer stamp comprising a porous material that is impregnated with a solution of a phosphonic acid, wherein the solution of a phosphonic acid comprises an organophosphonic acid in a diluent comprising an alcohol having 1 to 4 carbon atoms and/or a fluorinated solvent; and wherein the transfer stamp has a size and shape that approximate those of the integrated circuit package being tested.

2. The kit of claim 1, wherein the transfer stamp further comprises a non-porous backing material attached to and supporting the porous material.

3. The kit of claim 2, wherein the backing material comprises glass, metal, or a polymer.

4. The kit of claim 3 wherein the backing material comprises polyethylene and/or polypropylene.

5. The kit of claim 1, wherein the porous material comprises foamed polypropylene or foamed polyethylene.

6. A method of cleaning and coating a tip of a test probe in a test system for an integrated circuit package, said method comprising 1) aligning the integrated circuit package with a transfer stamp comprising a porous material that is impregnated with a solution of a phosphonic acid, wherein the solution of a phosphonic acid comprises an organophosphonic acid in a diluent comprising an alcohol having 1 to 4 carbon atoms and/or a fluorinated solvent; 2) pushing the test probe into the porous material of the transfer stamp to coat the tip with the solution of phosphonic acid; 3) removing the test probe from the porous material of the transfer stamp; and 4) allowing the solution of phosphonic acid to dry on the tip of the test probe and form a self-assembled monolayer of phosphonates thereon; wherein the transfer stamp has a size and shape that approximate those of the integrated circuit package being tested.

7. The method of claim 6, wherein the test probe comprises a pogo-pin that is spring-loaded within a socket.

8. The method of claim 6, wherein the transfer stamp further comprises a non-porous backing material attached to and supporting the porous material.

9. The method of claim 8, wherein the backing material comprises glass, metal, or a polymer.

10. The method of claim 9 wherein the backing material comprises polyethylene and/or polypropylene.

11. The method of claim 6, wherein the porous material comprises foamed polypropylene or foamed polyethylene.

12. The method of claim 6, wherein a self-assembled monolayer of phosphonates less than 5 nanometers thick is formed on the tip of the test probe.

\* \* \* \* \*